United States Patent
Chuang et al.

(10) Patent No.: US 7,339,398 B2
(45) Date of Patent: Mar. 4, 2008

(54) DRIVER IMPEDANCE CONTROL APPARATUS AND SYSTEM

(75) Inventors: Chien-Hui Chuang, Taipei Hsien (TW); Ren-Jeng Chiang, Taipei County (TW); Ih-Hwa Chang, Hsinchu Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 88 days.

(21) Appl. No.: 11/162,531

(22) Filed: Sep. 14, 2005

(65) Prior Publication Data

US 2007/0057692 A1    Mar. 15, 2007

(51) Int. Cl.
    *H03K 19/003* (2006.01)
(52) U.S. Cl. .............. 326/30; 326/83; 326/86; 327/108
(58) Field of Classification Search ............ 326/30, 326/86; 327/108
    See application file for complete search history.

(56) References Cited

U.S. PATENT DOCUMENTS

| 6,541,996 | B1 | 4/2003 | Rosefield et al. ............. 326/30 |
| 6,836,170 | B2 * | 12/2004 | Kitagawa et al. ........... 327/308 |
| 7,170,318 | B2 * | 1/2007 | Kim et al. .................... 326/83 |
| 2003/0062920 | A1 * | 4/2003 | Radhakrishnan ............. 326/30 |
| 2004/0113652 | A1 * | 6/2004 | Lundberg ..................... 326/30 |
| 2004/0239391 | A1 * | 12/2004 | Culler ........................ 327/170 |

* cited by examiner

*Primary Examiner*—Vibol Tan
(74) *Attorney, Agent, or Firm*—Winston Hsu (57) ABSTRACT

A driver impedance control apparatus and system for determining the impedance of at least one driver are provided. The driver impedance control apparatus includes a first reference impedance, a second reference impedance, a dummy pull-up array, a dummy pull-down array, a pull-up array control unit and a pull-down array control unit. The pull-up array control unit controls the pull-up impedance of the driver by detecting a voltage from a first voltage divide point between the first reference impedance and the dummy pull-up array. The pull-down array control unit controls the pull-down impedance of the driver by detecting a voltage from a second voltage divide point between the second reference impedance and the dummy pull-down array.

22 Claims, 6 Drawing Sheets

DRIVER IMPEDANCE CONTROL APPARATUS AND SYSTEM

BACKGROUND OF THE INVENTION

1. Field of the Invention

This invention generally relates to a driver impedance control apparatus, and especially to a driver impedance control apparatus and system, which can adjust impedance compensation to any voltage point, and can respectively compensate a pull-up impedance and a pull-down impedance of the driver.

2. Description of Related Art

Figure 1:
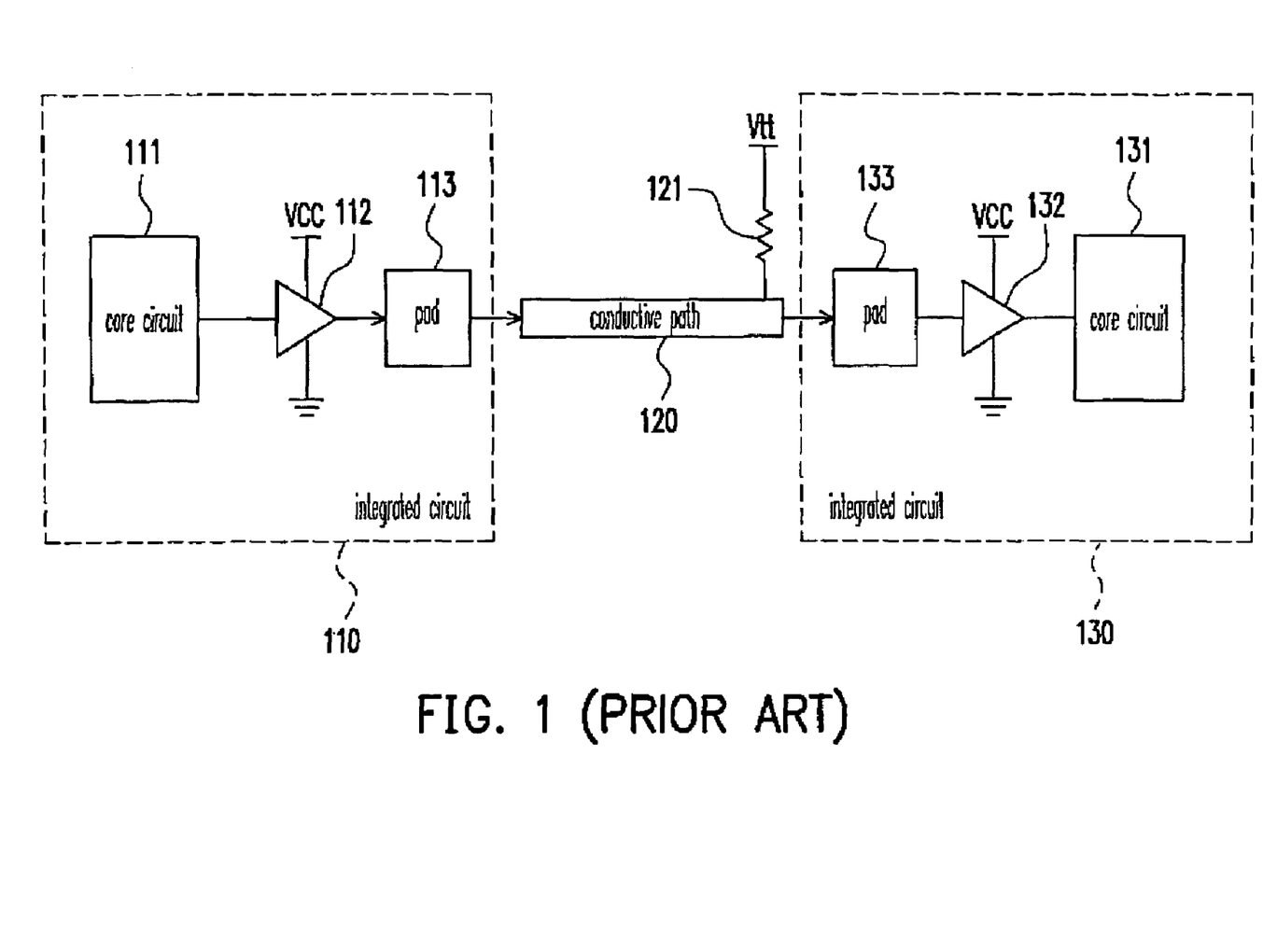
FIG. 1 is a block diagram of signal transmission between conventional integrated circuits.

FIG. 1 is a block diagram of signal transmission between conventional integrated circuits. In general, all of integrated circuits 110 and 130 are welded on a substrate, such as a printed circuit board, and the integrated circuits 110 and 130 transmit data to each other through a conductive path, such as a conduct path 120. When a core circuit 111 of the integrated circuits 110 transmits the data to the integrated circuit 130, a driver 112 transmits the output data of the core circuit 111, through a bonding pad 113, to the conductive path 120. Through the transmission of the conductive path 120, the driver 132, through a bonding pad 133, receives the data output by the integrated circuits 110, and transmits the data to a core circuit 131.

Along with gradually increasing clock of the system, the problem of impedance matching in the signal path is more important. In a high-frequency circuit, much noise can be mixed into the output signal of the integrated circuit 110 after transmitted at an external conductive path 120. Therefore, in general, a terminal resistor 121 is added to an end of the external conductive path 120 which is coupled to a receiver such as the integrated circuit 130, and another end of the terminal resistor 121 is coupled to a terminal voltage Vtt, for reducing noise. Wherein, the level of the terminal voltage Vtt is usually set as half of the power voltage VCC.

Further, in a high-frequency circuit, when an output impedance of the driver is not matched with the load impedance, a part of the output signal of the driver can be reflected and noise is therefore generated. Therefore, the driver 112 must be equipped with a mechanism which can adjust the output impedance, for adjusting the output impedance to match the load impedance. For example, a conventional technology disclosed by U.S. Pat. No. 6,541,996 utilizes an external resistor for determining and compensating the pull-up impedance and the pull-down impedance of the driver.

Figure 2:
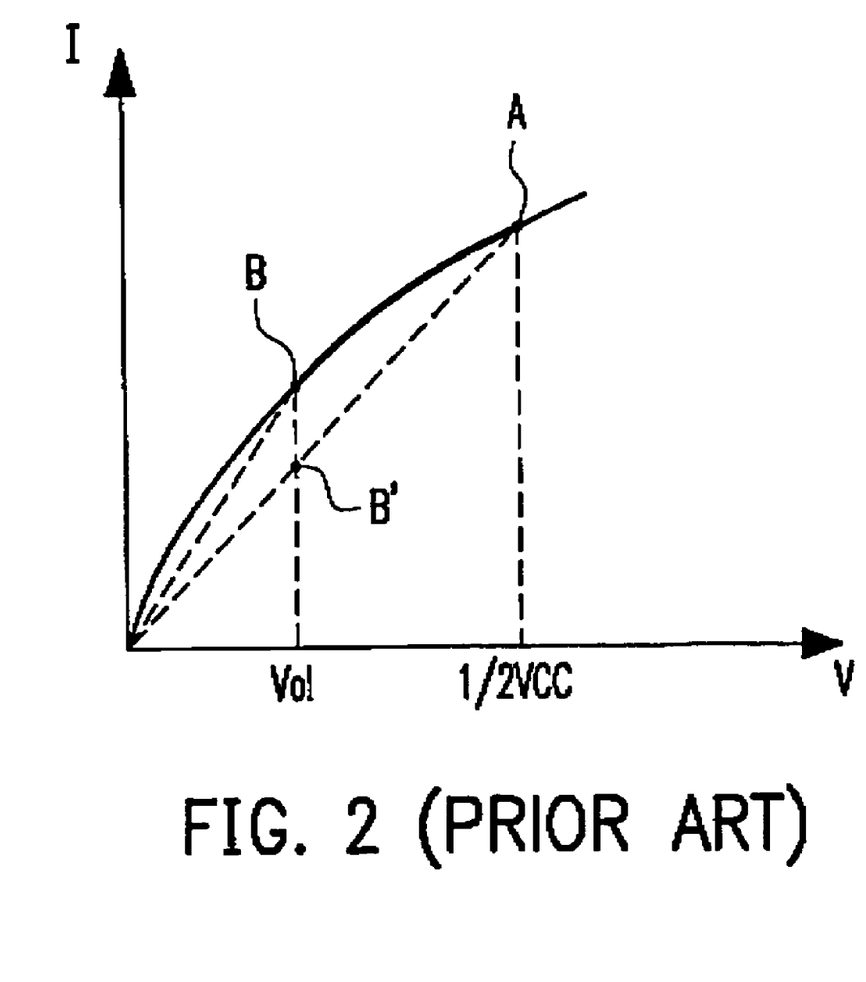
FIG. 2 schematically shows a voltage-current characteristic curve of a driver.

However, the conventional technology can only compensate the impedance of the VCC/2 voltage level. FIG. 2 is schematically shows a voltage-current characteristic curve of the driver. As shown in FIG. 2, the conventional technology can only compensate the impedance of the VCC/2 voltage level, which is point A in the figure. The above-mentioned conventional technology is not applicable, when compensating the impedance of the driver in other voltage level, such as Vol, is necessary. Recent method is to assume that the voltage-current characteristic of the driver is a linear relation, then the necessary impedance of the voltage level Vol, which is point B' in the figure, is deduced from the point A. However, in fact, the voltage-current characteristic of the driver is not the linear relation, therefore an error usually exists between the compensated impedance to the voltage level Vol by the conventional technology at the point B' and the necessary compensating impedance at a point B. That is, the conventional technology cannot correctly make impedance compensation to any of the voltage level.

SUMMARY OF THE INVENTION

An object of the present invention is to provide a driver impedance control apparatus and system, which can respectively compensate impedances to a pull-up impedance and a pull-down impedance of the driver simultaneously at any voltage level.

Another object of the present invention is to provide a driver impedance control apparatus and system, which, in addition to the above-mentioned objects, can further reduce external elements and can respectively compensate the pull-up impedance and the pull-down impedance of the driver.

According to the above-mentioned objects and other objects, the present invention provides a driver impedance control apparatus and system, for dynamically determining the impedance of at least one driver. The driver impedance control apparatus comprises a first reference impedance, a second reference impedance, a dummy pull-up array, a dummy pull-down array, a pull-up array control unit, and a pull-down array control unit. Wherein, a first end of the first reference impedance is coupled to a first voltage, such as a ground voltage, a second end is coupled to a first voltage dividing point. A first end of the second reference impedance is coupled to a second voltage, such as a power voltage, and a second end is coupled to a second voltage dividing point. The dummy pull-up array is coupled between the first voltage dividing point and the second voltage, for determining an impedance of the dummy pull-up array according to a pull-up adjusting signal. The dummy pull-down array is coupled between the second voltage dividing point and the first voltage, for determining an impedance of the dummy pull-down array according to a pull-down adjusting signal. The pull-up array control unit detects a voltage of the first voltage dividing point, and adjusts the impedance of the dummy pull-up array by providing the pull-up adjusting signal. The pull-down array control unit detects a voltage of the second voltage dividing point, and adjusts the impedance of the dummy pull-down array by providing the pull-down adjusting signal. Wherein, when the voltage of the first voltage dividing point achieves a first target level, and the voltage of the second voltage dividing point achieves a second target level, the pull-up array control unit and the pull-down array control unit respectively output a corresponding pull-up setting signal and a corresponding pull-down setting signal to the driver, according to the impedance status of the dummy pull-up array and the dummy pull-down array.

In another aspect, the present invention provides a driver impedance control apparatus and system, for dynamically determining the impedance of at least one driver. The driver impedance control apparatus comprises a reference impedance, a pull-up switch, a pull-down switch, a dummy pull-up array, a dummy pull-down array, and a control unit. A first end of the reference impedance is coupled to a third voltage, and a second end is coupled to a voltage dividing point. The above-mentioned third voltage for example is a terminal voltage. A first end of the pull-up switch is coupled to the voltage dividing point, for conducting the first end to the second end at a first period. A first end of the pull-down switch is coupled to the voltage dividing point, for conducting the first end to the second end at a second period. The dummy pull-up array is coupled between a second end of the pull-up switch and a second voltage, such as the power voltage, for determining an impedance of the dummy pull-up array according to a pull-up adjusting signal. The dummy pull-down array is coupled between the pull-down switch and a first voltage, such as the ground voltage, for determining an impedance of the dummy pull-down array according to a pull-down adjusting signal. The control unit detects a voltage of the voltage dividing point, and adjusts the impedance of the dummy pull-up array by providing the pull-up adjusting signal at the first period, and adjusts the impedance of the dummy pull-down array by providing the pull-down adjusting signal at the second period. Wherein, at the first period, when the voltage of the voltage dividing point achieves a first target level, the control unit provides a corresponding pull-up setting signal to the driver, according to impedance state of the dummy pull-up array; and at the second period, when the voltage of the voltage dividing point achieves a second target level, the control unit provides a corresponding pull-down setting signal to the driver, according to impedance state of the dummy pull-down array.

Since the dummy pull-up array, which represents the pull-up array of the driver, and the dummy pull-down array, which represents the pull-down array of the driver, are coupled to the reference impedance, which represents the load of the driver, the present invention can respectively perform the impedance compensation to the pull-up impedance and the pull-down impedance of the driver for any voltage simultaneously (or sequentially), by pre-determining the level of the internal reference voltage.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE EMBODIMENTS

Figure 3:
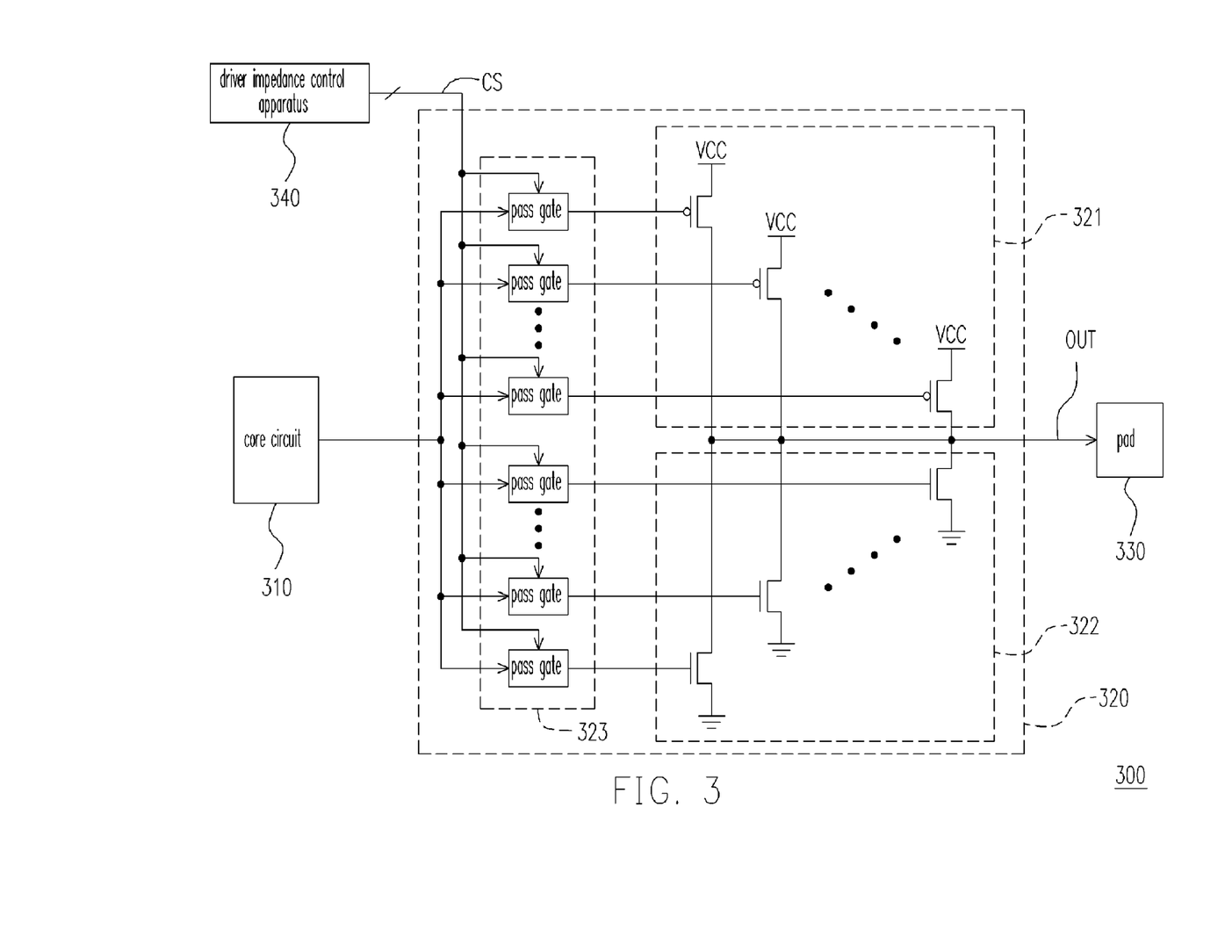
FIG. 3 is a block diagram of a drive circuit in an integrated circuit according to an embodiment of the present invention.

An output driver, also called an output buffer, of an integrated circuit is utilized in the embodiment of the present invention. FIG. 3 is a block diagram of a drive circuit in an integrated circuit according to an embodiment of the present invention. As shown in FIG. 3, the integrated circuit 300 comprises a core circuit 310, a driver 320, a bonding pad 330 and a driver impedance control apparatus 340. The driver impedance control apparatus 340 controls an impedance of the driver 320 by outputting compensation signals CS, which comprise a pull-up setting signal and a pull-down setting signal. When the core circuit 310 of the integrated circuit 300 is to transmit a signal to the outside, the driver 320 transmits the output signal of the core circuits 310 through the bonding pad 330 to the external conducting path (not shown).

The driver comprises an output pull-up array 321, an output pull-down array 322 and a pass gate array 323. The pass gate array 323 comprises a plurality of pass gates, each of which respectively determine whether or not to transmit the output signal of the core circuit 310 to the output pull-up array 321 or the output pull-down array 322 according to the corresponding signal of the compensation signals CS. The output pull-up array 321 and the output pull-down array 322 can pull-up or pull-down the output signal OUT according to the output of the pass gate array 323. That is, the output pull-up array 321 and the output pull-down array 322, according to the pull-up setting signal CS1 and the pull-down setting signal CS2 of the compensation signals CS, can respectively determine the amount of the pull-up circuit and the pull-down circuit, or determine the impedance values of the output pull-up array 321 and the output pull-down array 322. The driver impedance control apparatus 340 which generates the compensation signals CS can be implemented according to a following embodiment.

Figure 4:
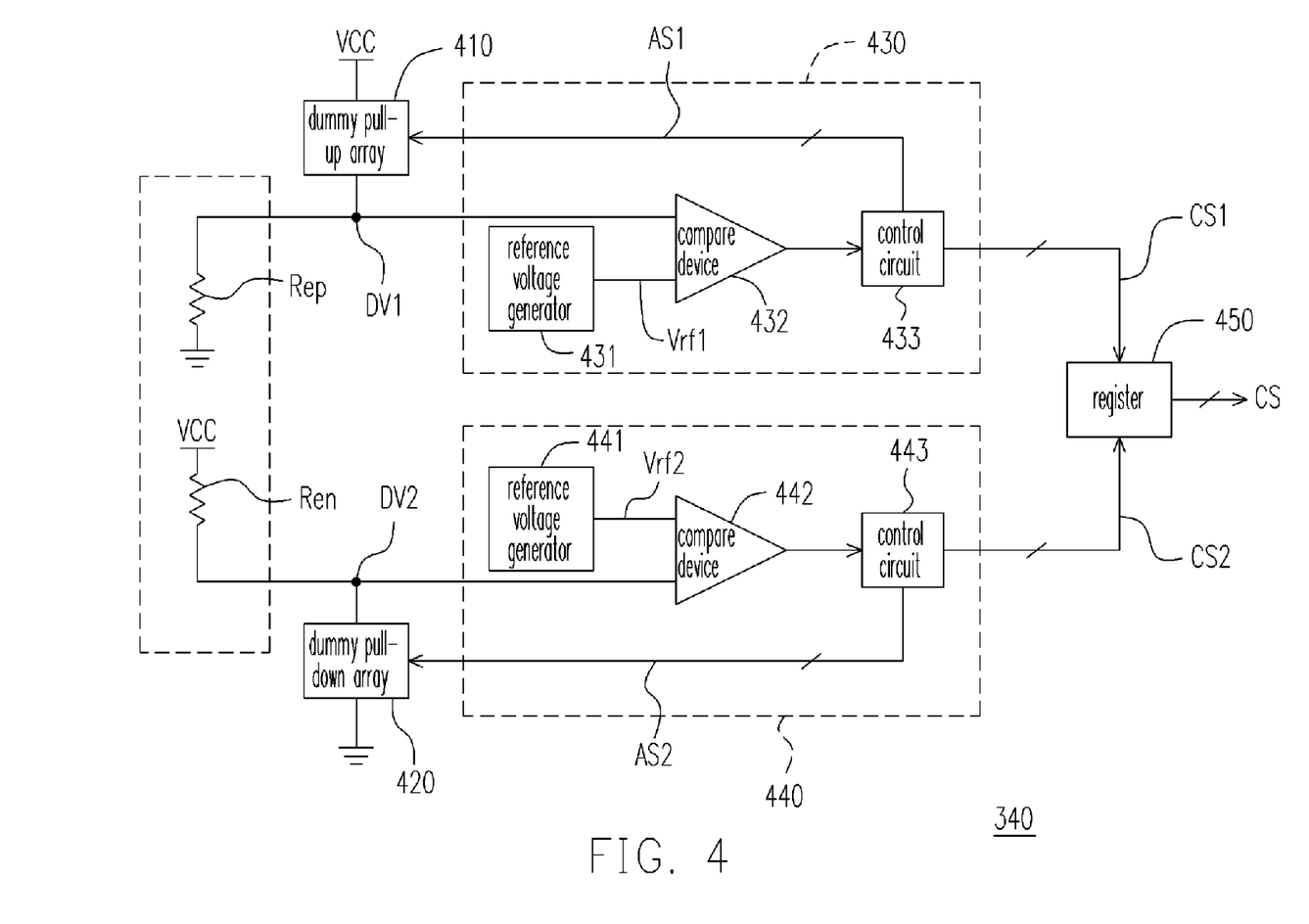
FIG. 4 schematically shows a driver impedance control apparatus according to an embodiment of the present invention.

FIG. 4 schematically shows the driver impedance control apparatus 340 according to an embodiment of the present invention. As shown in FIG. 3 and FIG. 4, the driver impedance control apparatus 340 comprises a first reference impedance Rep, a second reference impedance Ren, a dummy pull-up array 410, a dummy pull-down array 420, a pull-up array control unit 430, a pull-down array control unit 440, and a register 450. In the embodiment of the present invention, the reference impedances Rep and Ren which represent loads of the driver are external elements of the integrated circuit 300, and are implemented by resistive impedance, such as resistors. A first end of the reference impedance Rep is coupled to a first voltage, such as the ground voltage, and a second end is coupled to a first voltage dividing point DV1. A first end of the reference impedance Ren is coupled to a second voltage, such as a power voltage VCC, and a second end is coupled to a second voltage dividing point DV2.

The dummy pull-up array 410, which represents a pull-up array in the driver, is coupled between the voltage dividing point DV1 and the second voltage, for determining an impedance of the dummy pull-up array 410 according to a pull-up adjusting signal AS1 output by the pull-up array control unit 430. The pull-up array control unit 430 adjusts the impedance of the dummy pull-up array 410 by the output pull-up adjusting signal AS1, and detects a voltage of the voltage dividing point DV1 between the dummy pull-up array 410 and the reference impedance Rep. When the voltage of the voltage dividing point DV1 achieves a first target level, the pull-up array control unit 430 outputs a corresponding pull-up setting signal CS1 to the register 450, according to impedance state of the dummy pull-up array 410.

The dummy pull-down array 420, which represents a pull-down array in the driver, is coupled between the voltage dividing point DV2 and the first voltage, for determining an impedance of the dummy pull-down array 420 according to a pull-down adjusting signal AS2 output by the pull-down array control unit 440. The pull-down array control unit 440 adjusts the impedance of the dummy pull-down array 420 by the output pull-down adjusting signal AS2, and detects a voltage of the voltage dividing point DV2 between the dummy pull-down array 420 and the reference impedance Ren. When the voltage of the voltage dividing point DV2 achieves a second target level, the pull-down array control unit 440 outputs a corresponding pull-down setting signal CS2 to the register 450, according to impedance state of the dummy pull-down array 420. The register 450 receives and stores the pull-up setting signal CS1 and the pull-down setting signal CS2.

The register 450 further outputs the compensation signals CS, which comprise a pull-up setting signal CS1 and a pull-down setting signal CS2, to every driver. Each of the drivers of the integrated circuit 300 determines the impedance of the internal output pull-up array and the internal output pull-down array, according to the compensation signals CS which comprise a pull-up setting signal CS1 and a pull-down setting signal CS2.

Figure 5:
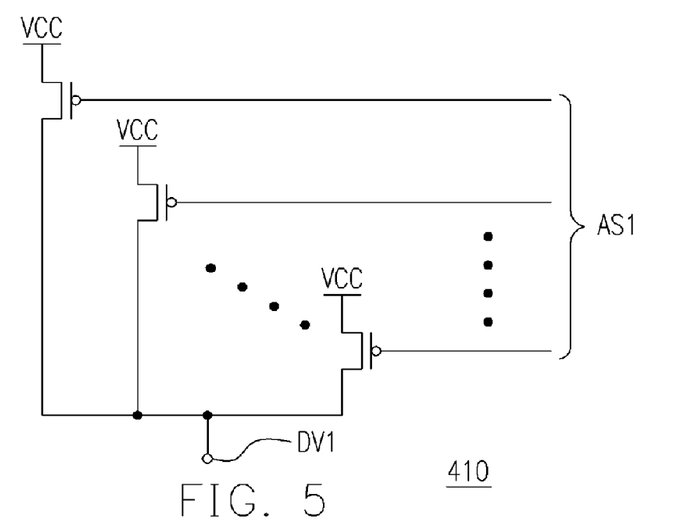
FIG. 5 schematically shows a circuit of dummy pull-up array as shown in FIG. 4 according to an embodiment of the present invention.
Figure 6:
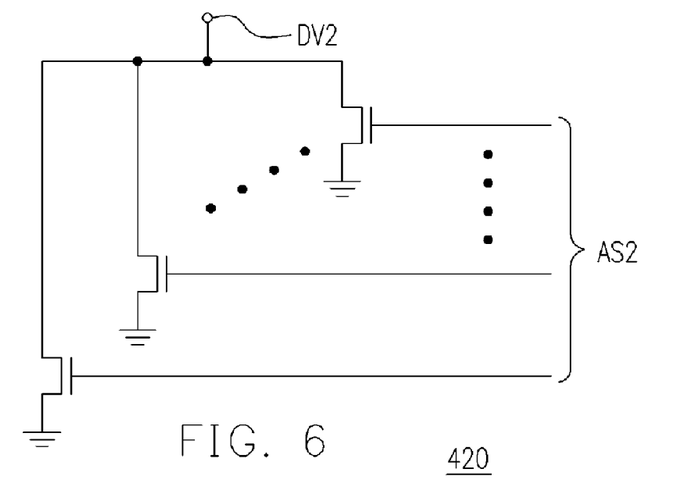
FIG. 6 schematically shows a circuit of dummy pull-down array as shown in FIG. 4 according to an embodiment of the present invention.

According to the embodiment of the present invention, the dummy pull-up array 410 is a copy circuit of the output pull-up array 321 of the driver 320, as shown in FIG. 5. Besides, the dummy pull-down array 420 is a copy circuit of the output pull-down array 322 of the driver 320, as shown in FIG. 6.

The above-mentioned pull-up array control unit 430 can comprise a first reference voltage generator 431, a first compare device 432, and a first control circuit 433. The first reference voltage generator 431 provides a first reference voltage Vrf1, the compare device 432 compares the voltage of the voltage dividing point DV1 with the first reference voltage Vref1 output by the reference voltage generator 431, and further outputs a comparing result to the control circuit 433. The operation process of the control circuit 433 is described as follows.

At the beginning of matching impedances, the control circuit 433 turns on all PMOS transistors in the dummy pull-up array 410 through the pull-up adjusting signal AS1, for example, and that is to adjust the impedance of the dummy pull-up array 410 to the minimum. Meanwhile, the voltage of the voltage divide point DV1 between the dummy pull-up array 410 and the reference impedance Rep is at the maximum; that is, the voltage of the voltage divide point DV1 is greater than the first reference voltage Vref1 output by the reference voltage generator 431. The compare device 432 compares the voltage of the voltage divide point DV1 with the first reference voltage Vref1, further outputs the comparing result to the control circuit 433. Since the voltage of the voltage divide point DV1 has not achieved the first target level yet, the control circuit 433 turns off one of the PMOS transistors in the dummy pull-up array 410 by emitting the pull-up adjusting signal AS1, and that is to adjust the impedance of the dummy pull-up array 410 to an upper level. Further, the control circuit 433, through the compare device 432, compares the voltage of the voltage divide point DV1 with the first reference voltage Vref1. When the voltage of the voltage divide point DV1 has not achieved the first target level yet, the control circuit 433 turns off another PMOS transistor in the dummy pull-up array 410 again by emitting the pull-up adjusting signal AS1, and that is to adjust the impedance of the dummy pull-up array 410 to an upper level again. The operation repeats until the voltage of the voltage divide point DV1 achieves the first target level. Further, the control circuit 433, according to the impedance state of the dummy pull-up array 410 (or the state of the pull-up adjusting signal AS1), outputs the corresponding pull-up setting signal CS1 and, through the register 450, provides to every driver of the integrated circuit 300, such as the driver 320. Since the dummy pull-up array 410 of the embodiment of the present invention is a copy circuit of the output pull-up array 321 of the driver 320, the pull-up setting signal CS1 can be the same signal with the pull-up adjusting signal AS1.

Figure 7:
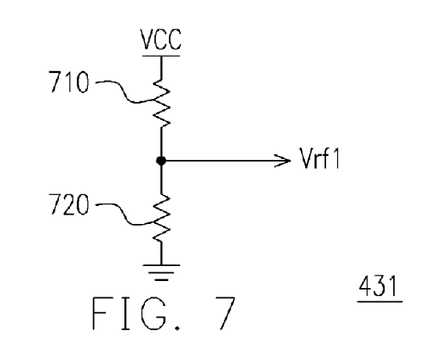
FIG. 7 schematically shows a circuit of a reference voltage generator as shown in FIG. 4 according to an embodiment of the present invention.

Those skilled in the art can perform the above-mentioned reference voltage generators 431 and 441 by utilizing any conventional technology, and only the reference voltage generator 431 is described as an example in the following. FIG. 7 schematically shows a circuit of a reference voltage generator 431 as shown in FIG. 4 according to an embodiment of the present invention. As shown in FIG. 7, the reference voltage generator 431 comprises resistors 710 and 720. The resistors 710 and 720 are connected in series and coupled between the power voltage VCC and the ground voltage. Wherein, the voltage of the voltage divide point between the resistors 710 and 720 is the first reference voltage Vref1 output by the reference voltage generator 431. The integrated circuit designer can freely decide the target voltage level of the compensating impedance by pre-determining a proportion of the resistance value between the resistors 710 and 720.

The above-mentioned pull-down array control unit 440 can comprise a second reference voltage generator 441, a second compare device 442, and a second control circuit 443. The reference voltage generator 441 provides a second reference voltage Vrf2, the compare device 442 compares the voltage of the voltage dividing point DV2 with the second reference voltage Vrf2 output by the reference voltage generator 441, and further outputs a comparing result to the control circuit 443. The operation process of the control circuit 443 is described as follows.

At the beginning of matching impedances, the control circuit 443 turns on all PMOS transistors in the dummy pull-down array 420 through the pull-down adjusting signal AS2, for example, and that is to adjust the impedance of the dummy pull-down array 420 to the minimum. Meanwhile, the voltage of the voltage divide point DV2 between the dummy pull-down array 420 and the reference impedance Ren is at the minimum; that is, the voltage of the voltage divide point DV2 is smaller than the second reference voltage Vref2 output by the reference voltage generator 441. The compare device 442 compares the voltage of the voltage divide point DV2 with the second reference voltage Vref2, further outputs the comparing result to the control circuit 443. Since the voltage of the voltage divide point DV2 has not achieved the second target level yet, the control circuit 443 turns off one of the PMOS transistors in the dummy pull-up array 410 by emitting the pull-down adjusting signal AS2, and that is to adjust the impedance of the dummy pull-up array 420 to an upper level. Further, the control circuit 443, through the compare device 442, compares the voltage of the voltage divide point DV2 with the second reference voltage Vref2. When the voltage of the voltage divide point DV2 has not achieved the second target level yet, the control circuit 443 turns off another PMOS transistor in the dummy pull-up array 420 again by emitting the pull-down adjusting signal AS2, and that is to adjust the impedance of the dummy pull-up array 420 to an upper level again. The operation repeats until the voltage of the voltage divide point DV2 achieves the second target level. Further, the control circuit 443, according to the impedance state of the dummy pull-down array 420 (or the state of the pull-down adjusting signal AS2), outputs the corresponding pull-down setting signal CS2 and, through the register 450, provides to every driver of the integrated circuit 300 such as the driver 320. Since the dummy pull-down array 420 of the embodiment of the present invention is a copy circuit of the output pull-down array 322 of the driver 320, the pull-down setting signal CS2 can be the same signal with the pull-down adjusting signal AS2.

Therefore, by comparing the voltage level of the internal reference voltage Vref1 with the voltage of the voltage divide point DV1 between the dummy pull-up array 410, which represents the pull-up array of the driver, and the reference impedance Rep, which represents the load of the driver, and by comparing the voltage level of the internal reference voltage Vref2 with the voltage of the voltage divide point DV2 between the dummy pull-down array 420, which represents the pull-down array of the driver, and the reference impedance Ren, which represents the load of the driver, the above-mentioned embodiment of the present invention can respectively compensate the impedances to the pull-up impedance and the pull-down impedance of the driver simultaneously for any voltage level.

The above-mentioned embodiment of the present invention utilizes the external resistors Rep and Ren, which are coupled to the integrated circuit 300, as the first reference impedance and the second reference impedance of the driver impedance control apparatus 340. The following is another embodiment, in which the external resistor is reduced, according to the spirit of the invention.

Figure 8:
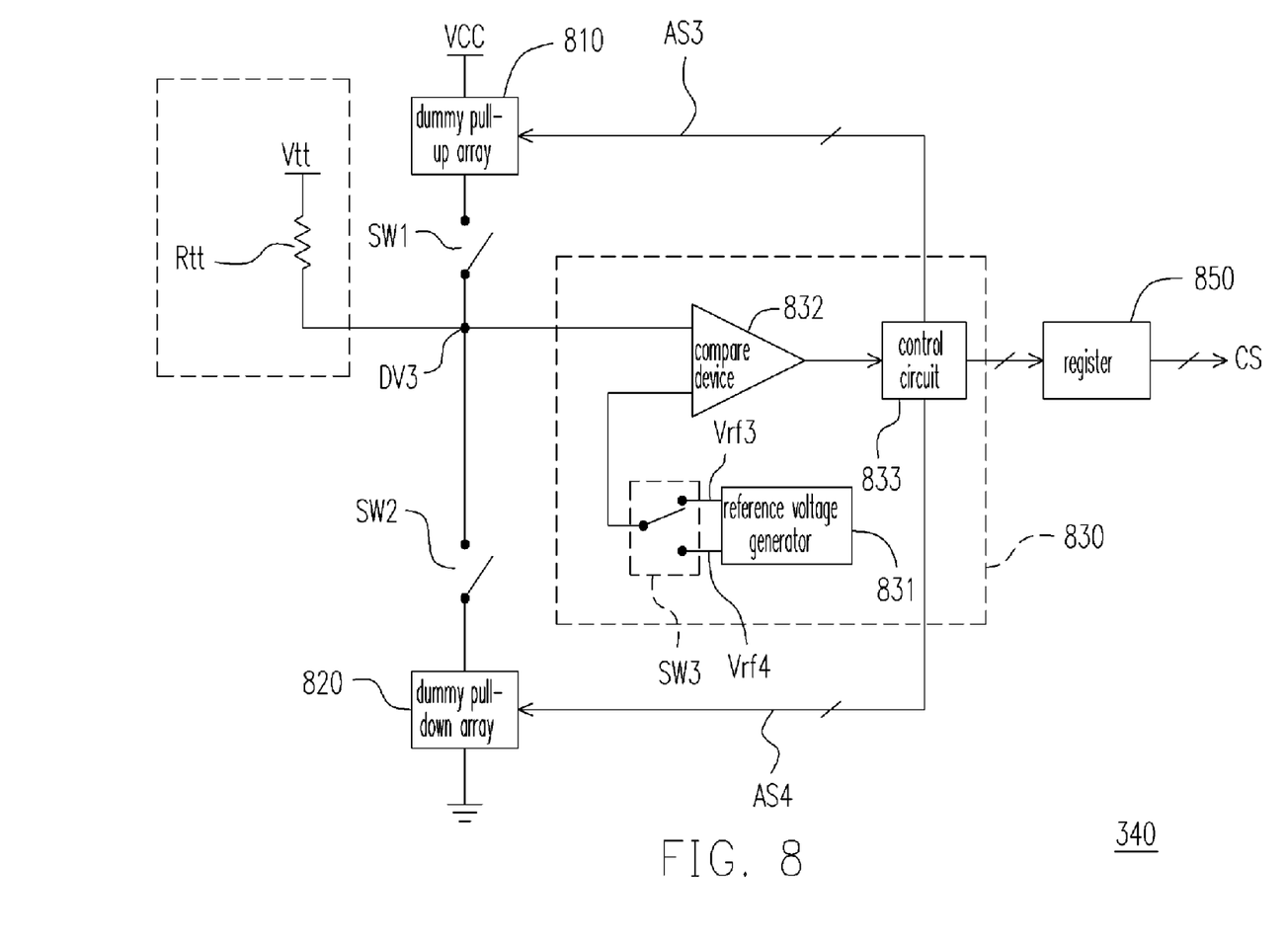
FIG. 8 schematically shows another driver impedance control apparatus according to an embodiment of the present invention.

FIG. 8 schematically shows another driver impedance control apparatus according to an embodiment of the present invention. As shown in FIG. 3 and FIG. 8, the driver impedance control apparatus 340 comprises a reference impedance Rtt, a pull-up switch SW1, a pull-down switch SW2, a dummy pull-up array 810, a dummy pull-down array 820, a control unit 830, and a register 850. In the embodiment of the present invention, the reference impedance Rtt, which represents a load of the driver, is an external element of the integrated circuit 300, and is an resistive impedance, such as a resistor. A first end of the reference impedance Rtt is coupled to a second voltage, and a second end is coupled to a voltage dividing point DV3. In the embodiment of the present invention, the above-mentioned third voltage is a terminal voltage Vtt, for example. The level of the terminal voltage Vtt is set up as half of the level of the power voltage VCC, for example.

A first end of the pull-up switch SW1 is coupled to the voltage divide point DV3, for turning on the first end to the second end at a first period, and turning off the first end with the second end at other time. A first end of the pull-up switch SW2 is coupled to the voltage divide point DV3, for turning on the first end to the second end at a second period, and turning off the first end with the second end at other time.

The dummy pull-up array 810, which represents the pull-up array 321 of the driver 320, is coupled between a second end of the pull-up switch SW1 and a second voltage, such as the power voltage VCC, for determining an impedance of the dummy pull-up array 810 according to a pull-up adjusting signal AS3. At the first period, when the switch SW1 is turned on and the switch SW2 is turned off, the control unit 830 adjusts the impedance of the dummy pull-up array 810 by outputting the pull-up adjusting signal AS3, and detects a voltage of the voltage divide point DV3 between the dummy pull-up array 810 and the reference impedance Rtt. When the voltage of the voltage divide point DV3 achieves a first target level, the control unit 830 outputs a corresponding pull-up setting signal to the register 850, according to the impedance state of the dummy pull-up array 810.

The dummy pull-down array 820, which represents the pull-down array 322 of the driver 320, is coupled between a second end of the pull-down switch SW2 and a first voltage, such as the ground voltage, for determining an impedance of the dummy pull-down array 820 according to a pull-down adjusting signal AS4. At the second period, when the switch SW2 is turned on and the switch SW1 is turned off, the control unit 830 adjusts the impedance of the dummy pull-down array 820 by outputting the pull-down adjusting signal AS4, and detects a voltage of the voltage divide point DV3 between the dummy pull-down array 820 and the reference impedance Rtt. When the voltage of the voltage divide point DV3 achieves a second target level, the control unit 830 outputs a corresponding pull-down setting signal to the register 850, according to the impedance state of the dummy pull-down array 820.

The register 850 receives and stores the pull-up setting signal and the pull-down setting signal output sequentially by the control unit 830, combines and outputs the signals as the compensation signal. The register 850 outputs the compensation signals CS, which comprise a pull-up setting signal and a pull-down setting signal, to every driver in the integrated circuit 300. Each of the drivers of the integrated circuit 300 determines the impedances of the internal output pull-up array and the internal output pull-down array, according to the compensation signals CS which comprise a pull-up setting signal and a pull-down setting signal.

In the embodiment of the present invention, the dummy pull-up array 810 is a copy circuit of the output pull-up array 321 of the driver 320, as shown in FIG. 5. Besides, the dummy pull-down array 820 is a copy circuit of the output pull-down array 322 of the driver 320, as shown in FIG. 6.

The above-mentioned control unit 830 can comprise a reference voltage generator 831, a selection device SW3, a compare device 832 and a control circuit 833. The control unit 830 provides a first reference voltage Vrf3 and a second reference voltage Vref4. The selection device SW3 is coupled to the reference voltage generator 831, for selecting and outputting the reference voltage Verf3 at the first period, and selecting and outputting the reference voltage Vref4 at the second period.

At the first period, the compare device 832 compares the voltage of the voltage divide point DV3 with the reference voltage Vref3 output by the selection device SW3, and therefore outputs a comparing result. In the meanwhile, the control circuit 833 adjusts the pull-up adjusting signal AS3 according to the comparing result output by the compare device 832. When the voltage of the voltage divide point DV3 achieves a first target level, the control circuit 833 provides the corresponding pull-up setting signal to the register 850, according to the impedance state of the dummy pull-up array 810 or the state of the pull-up adjusting signal AS3.

At the second period, the compare device 832 compares the voltage of the voltage divide point DV3 with the reference voltage Vref4 output by the selection device SW3, and therefore outputs a comparing result. In the meanwhile, the control circuit 833 adjusts the pull-down adjusting signal AS4 according to the comparing result output by the compare device 832. When the voltage of the voltage divide point DV3 achieves a second target level, the control circuit 833 provides the corresponding pull-down setting signal to the register 850, according to the impedance state of the dummy pull-down array 820 or the state of the pull-down adjusting signal AS4.

Therefore, at the first period, by comparing the level of the internal pre-determined reference voltage Vref3 with the voltage of the voltage divide point DV3 between the dummy pull-up array 810 and the reference impedance Rff, the present invention can control the pull-up impedance of the driver at any voltage level. Further, at the second period, by comparing the level of the internal pre-determined reference voltage Vref4 with the voltage of the voltage divide point DV3 between the dummy pull-down array 820 and the reference impedance Rff, the present invention can control the pull-down impedance of the driver at any voltage level.

In summary of the above, since the dummy pull-up array, which represents the pull-up array of the driver, and the dummy pull-down array, which represents the pull-down array of the driver, are coupled to the reference impedance, which represents the load of the driver, the driver impedance control apparatus of the present invention can respectively perform the impedance compensation to the pull-up impedance and the pull-down impedance of the driver at any voltage level simultaneously (or sequentially), by the pre-determined the internal reference voltage level.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A driver impedance control apparatus, for dynamically determining the impedance of at least one driver, comprising:
    a first reference impedance, wherein a first end thereof is coupled to a first voltage, a second end thereof is coupled to a first voltage divide point;
    a second reference impedance, wherein a first end thereof is coupled to a second voltage, a second end thereof is coupled to a second voltage divide point;
    a dummy pull-up array, coupled between the first voltage divide point and the second voltage, for determining an impedance of the dummy pull-up array according to a pull-up adjusting signal;
    a dummy pull-down array, coupled between the second voltage divide point and the first voltage, for determining an impedance of the dummy pull-down array according to a pull-down adjusting signal;
    a pull-up array control unit, for detecting a voltage of the first voltage divide point, and adjusting the impedance of the dummy pull-up array by providing the pull-up adjusting signal; and
    a pull-down array control unit, for detecting a voltage of the second voltage divide point, and adjusting the impedance of the dummy pull-down array by providing the pull-down adjusting signal;
    wherein when the voltage of the first voltage divide point achieves a first target level, and the voltage of the second voltage divide point achieves a second target level, the pull-up array control unit and the pull-down array control unit respectively output a corresponding pull-up setting signal and a corresponding pull-down setting signal to the driver according to impedance states of the dummy pull-up array and the dummy pull-down array, and the driver impedance control apparatus further comprises a register coupled to the pull-up array control unit and the pull-down array control unit for receiving and storing the pull-up setting signal and the pull-down setting signal and providing the stored signals to the driver.

2. The driver impedance control apparatus of claim 1, wherein the first voltage is a ground voltage, and the second voltage is a power voltage.

3. The driver impedance control apparatus of claim 1, wherein the first reference impedance and the second reference impedance are a resistive impedance.

4. The driver impedance control apparatus of claim 1, wherein the pull-up array control unit comprises:
    a first reference voltage generator, for providing a first reference voltage;
    a first compare device, for comparing the voltage of the first voltage divide point with the first reference voltage, and further outputting a comparing result; and
    a first control circuit, for adjusting the pull-up adjusting signal according to the comparing result, and adjusting the impedance of the dummy pull-up array by the pull-up adjusting signal, wherein when the voltage of the first voltage divide point achieves the first target level, the first control circuit provides the corresponding pull-up setting signal to the driver according to the state of the pull-up adjusting signal.

5. The driver impedance control apparatus of claim 1, wherein pull-down array control unit comprises:
    a second reference voltage generator, for providing a second reference voltage;
    a second compare device, for comparing the voltage of the second voltage divide point with the second reference voltage, and further outputting a comparing result; and
    a second control circuit, for adjusting the pull-down adjusting signal according to the comparing result, and adjusting the impedance of the dummy pull-down array by the pull-down adjusting signal, wherein when the voltage of the second voltage divide point achieves the second target level, the second control circuit provides the corresponding pull-down setting signal to the driver according to the state of the pull-down adjusting signal.

6. A driver impedance control system, comprising:
    a first reference impedance, wherein a first end thereof is coupled to a first voltage, and a second end thereof is coupled to a first voltage divide point;
    a second reference impedance, wherein a first end thereof is coupled to a second voltage, and a second end thereof is coupled to a second voltage divide point; and
    an integrated circuit, comprising:
        at least a driver, comprising:
            an output pull-up array; and
            an output pull-down array; and
        a driver impedance control apparatus, comprising:
            a dummy pull-up array, coupled between the first voltage divide point and the second voltage, for determining an impedance of the dummy pull-up array according to a pull-up adjusting signal;
            a dummy pull-down array, coupled between the second voltage divide point and the first voltage, for determining an impedance of the dummy pull-down array according to a pull-down adjusting signal;
            a pull-up array control unit, for detecting a voltage of the first voltage divide point, and adjusting the impedance of the dummy pull-up army by providing the pull-up adjusting signal;
            a pull-down array control unit, for detecting a voltage of the second voltage divide point, and adjusting the impedance of the dummy pull-down array by providing the pull-down adjusting signal; and
            a register, Coupled to the pull-up array control unit and the pull-down array control unit, for receiving and storing the pull-up setting signal and the pull-down setting signal, and providing the stored signals to the driver, wherein, when the voltage of the first voltage divide point achieves a first target level, and the voltage of the second voltage dividing point achieves a second target level, the pull-up array control unit and the pull-down array control unit respectively output a corresponding pull-up setting signal and a corresponding pull-down setting signal to the driver, according to impedance states of the dummy pull-up array and the dummy pull-down array-, and the output pull-up array and the output pull-down array respectively receive the pull-up setting signal and the pull-down setting signal, and determine the impedances according to the pull-up setting signal and the pull-down setting signal.

7. The driver impedance control system of claim 6, wherein the first voltage is a ground voltage, and the second voltage is a power voltage.

8. The driver impedance control system of claim 6, wherein the dummy pull-up array is a copy of the output pull-up array, and the dummy pull-down array is a copy of the output pull-down array.

9. The driver impedance control system of claim 6, wherein the pull-up array control unit comprises:
 a first reference voltage generator, for providing a first reference voltage;
 a first compare device, for comparing the voltage of the first voltage dividing point with the first reference voltage, and further outputting a comparing result; and
 a first control circuit, for adjusting the pull-up adjusting signal according to the comparing result, and adjusting the impedance of the dummy pull-up array by the pull-up adjusting signal, wherein when the voltage of the first voltage divide point achieves the first target level, the first control circuit provides the corresponding pull-up setting signal to the driver according to the state of the pull-up adjusting signal.

10. The driver impedance control system of claim 6, wherein the pull-down array control unit comprises:
 a second reference voltage generator, for providing a second reference voltage;
 a second compare device, for comparing the voltage of the second voltage divide point with the second reference voltage, and further outputting a comparing result; and
 a second control circuit, for adjusting the pull-down adjusting signal according to the comparing result, and adjusting the impedance of the dummy pull-down array by the pull-down adjusting signal, wherein when the voltage of the second voltage divide point achieves the second target level, the second control circuit provides the corresponding pull-down setting signal to the driver according to the state of the pull-down adjusting signal.

11. A driver impedance control apparatus, for dynamically determining the impedance of at least one driver, comprising:
 a reference impedance, wherein a first end thereof is coupled to a third voltage, and a second end thereof is coupled to a voltage divide point;
 a pull-up switch, wherein a first end thereof is coupled to the voltage divide point, for turning on the first end thereof to the second end thereof at a first period;
 a pull-down switch, wherein a first end thereof is coupled to the voltage divide point, for turning on the first end thereof to the second end thereof at a second period;
 a dummy pull-up array, coupled between the second end of the pull-up switch and a second voltage, for determining an impedance of the dummy pull-up array according to a pull-up adjusting signal;
 a dummy pull-down army, coupled between the second end of the pull-down switch and a first voltage, for determining an impedance of the dummy pull-down array according to a pull-down adjusting signal; and
 a control unit, for detecting a voltage of the voltage divide point and adjusting the impedance of the dummy pull-up array by providing the pull-up adjusting signal at the first period, and adjusting the impedance of the dummy pull-down array by providing the pull-down adjusting signal at the second period;
 wherein, at the first period, when the voltage of the voltage divide point achieves a first target level, the control unit provides a corresponding pull-up setting signal to the driver, according to impedance states of the dummy pull-up array; and
 at the second period, when the voltage of the voltage divide point achieves a second target level, the control unit provides a corresponding pull-down setting signal to the driver, according to the impedance states of the dummy pull-down array.

12. The driver impedance control apparatus of claim 11, wherein the first voltage is a ground voltage, and the second voltage is a power voltage.

13. The driver impedance control apparatus of claim 12, wherein the third voltage is a terminal voltage.

14. The driver impedance control apparatus of claim 13, wherein the voltage level of the terminal voltage is half of the power voltage.

15. The driver impedance control apparatus of claim 11, wherein the impedance is an resistive impedance.

16. The driver impedance control apparatus of claim 11, wherein the control unit comprises:
 a reference voltage generator, far providing a first reference voltage and a second reference voltage;
 a selection device, coupled to the reference voltage generator, for selecting and outputting the first reference voltage at the first period, and selecting and outputting the second reference voltage at the second period;
 a compare device, coupled to the voltage divide point and the selection device, for comparing the voltage of the voltage divide point with the output of the selection device, and therefore outputting a comparing result; and
 a control circuit, for adjusting the pull-up adjusting signal according to the comparing result at the first period, and adjusting the pull-down adjusting signal according to the comparing result at the second period,
 wherein, at the first period, when the voltage of the voltage divide point achieves the first target level, the control circuit provides the corresponding pull-up setting signal to the driver, according to the state of the pull-up adjusting signal; and
 at the second period, when the voltage of the voltage divide point achieves the second target level, the control circuit provides the corresponding pull-down setting signal to the driver, according to the state of the pull-down adjusting signal.

17. The driver impedance control apparatus of claim 11, further comprising a register, coupled to the control unit, for receiving and storing the pull-up setting signal, at the first period, receiving and storing the pull-down setting signal at the second period, and providing the stored pull-up setting signal and the stored pull-down setting signal to the driver.

18. A driver impedance control system, comprising:
 a reference impedance, wherein a first end thereof is coupled to a third voltage, a second end thereof is coupled to a voltage divide point; and an integrated circuit, comprising:
  at least a driver, comprising:
    an output pull-up array; and
    an output pull-dawn array; and
  a driver impedance control apparatus, comprising:
    a pull-up switch, wherein a first end Thereof is coupled to the voltage divide point, for turning on the first end thereof to the second end thereof at a first period;
    a pull-down switch, wherein a first end thereof is coupled to the voltage divide point, for turning on the first end thereof to the second end thereof at a second period;
    a dummy pull-up array, coupled between the second end of the pull-up switch and a second voltage, for determining the impedance of the dummy pull-up array according to a pull-up adjusting signal;
    a dummy pull-down array, coupled between the second end of the pull-down switch and a first voltage, for determining the impedance of the dummy pull-down array according to a pull-down adjusting signal; and
    a control unit, for detecting the voltage of the voltage divide point, and adjusting the impedance of the dummy pull-up array by providing the pull-up adjusting signal at the first period, and adjusting the impedance of the dummy pull-down array by providing the pull-down adjusting signal at the second period;
  wherein, at the first period, when the voltage of the voltage divide point achieves a first target level, the control unit provides a corresponding pull-up setting signal to the driver, according to the impedance state of the dummy pull-up array;
  at the second period, when the voltage of the voltage divide point achieves a second target level, the control unit provides a corresponding pull-down setting signal to the driver, according to the impedance state of the dummy pull-down array; and
  the output pull-up array and the output pull-down array respectively determine the impedances according to the pull-up setting signal and the pull-down setting signal.

19. The driver impedance control system of claim 18, wherein, the first voltage is a ground voltage, the second voltage is a power voltage, and the third voltage is a terminal voltage.

20. The driver impedance control system of claim 19, wherein, the level of the terminal voltage is half of the power voltage.

21. The driver impedance control system of claim 18, wherein, the dummy pull-up array is a copy of the output pull-up array, and the dummy pull-down array is a copy of the output pull-down array.

22. The driver impedance control system of claim 18, wherein, the control unit comprises:
  a reference voltage generator, for providing a first reference voltage and a second reference voltage;
  a selection device, coupled to the reference voltage generator, for selecting and outputting the first reference voltage at the first period, and selecting and outputting the second reference voltage at the second period;
  a compare device, coupled to the voltage divide point and the selection device, for comparing the voltage of the voltage divide point with the output of the selection device, and therefore outputting a comparing result; and
  a control circuit, for adjusting the pull-up adjusting signal according to the comparing result at the first period, and adjusting the pull-down adjusting signal according to the comparing result at the second period,
  wherein, at the first period, when the voltage of the voltage divide point achieves the first target level, the control circuit provides the corresponding pull-up setting signal to the driver, according to the state of the pull-up adjusting signal; and
  at the second period, when the voltage of the voltage divide point achieves the second target level, the control circuit provides the corresponding pull-down setting signal to the driver, according to the state of the pull-down adjusting signal.

* * * * *